(12) United States Patent
Chou et al.

(10) Patent No.: US 6,426,305 B1
(45) Date of Patent: Jul. 30, 2002

(54) PATTERNED PLASMA NITRIDATION FOR SELECTIVE EPI AND SILICIDE FORMATION

(75) Inventors: Anthony I. Chou, Beacon, NY (US); Toshiharu Furukawa, Essex Junction, VT (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/898,202

(22) Filed: Jul. 3, 2001

(51) Int. Cl.$^7$ ................................ H01L 21/31
(52) U.S. Cl. .................. 438/758; 438/775; 438/788
(58) Field of Search ........................ 438/776, 775, 438/758, 788, 777

(56) References Cited

U.S. PATENT DOCUMENTS

| | | | |
|---|---|---|---|
| 4,788,082 A | 11/1988 | Schmitt | 427/248.1 |
| 5,904,566 A | 5/1999 | Tao et al. | 438/689 |
| 6,110,842 A | 8/2000 | Okuno et al. | 438/776 |
| 6,136,654 A | 10/2000 | Kraft et al. | 438/287 |
| 6,140,024 A | 10/2000 | Misium et al. | 430/314 |
| 6,143,608 A | 11/2000 | He et al. | 438/264 |
| 6,221,792 B1 * | 4/2001 | Yang et al. | 438/776 |
| 6,261,973 B1 * | 7/2001 | Misium et al. | 438/775 |

FOREIGN PATENT DOCUMENTS

JP          57-23239 A       6/1982

* cited by examiner

*Primary Examiner*—John F. Niebling
*Assistant Examiner*—Olivia Luk
(74) *Attorney, Agent, or Firm*—Scully, Scott, Murphy & Presser; Margaret A. Pepper

(57) ABSTRACT

A method of selectively forming either an epi-Si-containing or a silicide layer on portions of a Si-containing substrate wherein a nitrogen-containing layer formed by a low-temperature nitridation process is employed to prevent formation of the epi-Si-containing or silicide layer in predetermined areas of the substrate. The method of the present invention includes the steps of subjecting at least one exposed surface of a Si-containing substrate to a low-temperature nitridation process so as to form a nitrogen-containing layer at or near the at least one exposed surface, wherein other surfaces of the Si-containing substrate are protected by a patterned photoresist; removing the patterned photoresist from the other surfaces of the Si-containing substrate; and forming an epi-Si-containing layer or a silicide layer on the other surfaces of the substrate which do not contain the nitrogen-containing layer. In accordance with the present invention, epi-Si-containing or silicide is not formed in areas containing the nitrogen-containing layer.

36 Claims, 3 Drawing Sheets

PATTERNED PLASMA NITRIDATION FOR SELECTIVE EPI AND SILICIDE FORMATION

FIELD OF THE INVENTION

The present invention relates to semiconductor device manufacturing, and more particularly to methods of incorporating nitrogen at or near a silicon surface so as to be capable of forming either an epi-silicon-containing layer or a silicide layer on selective portions of the silicon surface.

BACKGROUND OF THE INVENTION

In the manufacturing of semiconductor devices, it is well known that nitrogen present at or near the silicon surface of a semiconductor device changes many surface properties of the silicon. The ability to introduce nitrogen in different areas of a semiconductor chip or wafer allows for fabrication of different structures and devices in a cost effective manner, by reducing the number of steps required to make the structure.

As stated above, nitrogen affects many surface, or near surface properties of a semiconductor device. Some of the more significant ones include: (i) oxidation rate; (ii) silicide formation; (iii) selective epitaxial growth; and (iv) boron diffusion.

In regard to oxidation rate, it is well known that nitrogen reduces oxidation rate and that a higher concentration of nitrogen formed within or near a silicon surface results in slower oxidation rate. Insofar as silicide formation is concerned, nitrogen serves to block or reduce silicide formation by preventing the reaction between a refractory metal, e.g., Ti or Co, and the underlying silicon layer.

In epitaxial growth, which occurs on bare silicon surfaces without nitrogen at the surface, nitrogen can be used in such a process to prevent the single crystal deposition of epitaxial silicon. That is, nitrogen can be used as a surface masking layer so as to prevent epitaxial silicon growth from occurring in the regions containing nitrogen.

With respect to boron diffusion, nitrogen reduces boron diffusion; therefore nitrogen can be used to prevent channeling of boron into silicon surfaces, i.e., boron diffusion from a gate region into an underlying silicon surface.

Various prior art methods for patterned incorporation of nitrogen into a surface of a silicon-containing substrate are known and have been successfully employed in the semiconductor industry. For example, it is known in the prior art to implant nitrogen into selective regions by utilizing photoresist patterning. Such a prior art process is depicted in FIG. 1 wherein reference numeral 10 denotes a Si-containing substrate, reference numeral 12 denotes a patterned photoresist and reference numeral 14 denotes $N^+$ or $N_2^+$ ions being incorporated into Si-containing substrate 10 via ion implantation. The region labeled as 16 in FIG. 1 denotes the area in which nitrogen is implanted within substrate 10. The prior art process depicted in FIG. 1 is advantageous because the ion implantation process is typically carried out at room temperature which is directly compatible with the patterned photoresist.

Despite the above advantages, the prior art nitrogen ion implantation process, which is typically performed at high doses, causes resist hardening. Hardened resist are difficult to remove using conventional stripping processes well known in the art. Additionally, prior art nitrogen ion implantation processes may cause undesirable contamination problems. In particularly, prior art nitrogen ion implantation processes may result in implant damage in the substrate which may lead to increased oxidation rate and degraded mobility of implanted ions within the substrate. Moreover, in the prior art, nitrogen is typically implanted well below the surface of the silicon, not at the surface. Hence, a thermal cycle is needed to diffuse the implanted nitrogen ions to the silicon surface and residual nitrogen may be left in the substrate where it can have undesirable effects.

Another prior art method of introducing nitrogen into a surface is by utilizing a thermal nitridation process. Typically, prior art thermal nitridation processes are performed at temperatures greater than about 700° C. using NO, $N_2O$ or $NH_3$ as the nitrogen-containing ambient. A typical prior art nitridation process is shown, for example, in FIGS. 2A–D. Specifically, FIG. 2A comprises Si-containing substrate 10, hard masking layer, e.g., an oxide or nitride, 18, and patterned photoresist 12. Such a structure is fabricated using conventional techniques well known in the art. Since the photoresist cannot withstand the high-temperature nitridation process, it is employed in the prior art as a means for 10 patterning the underlying hardmask, which can withstand the high-temperatures associated with prior art nitridation process. FIG. 2B shows the structure that is formed after a conventional dry etching process such as reactive ion etching is employed in transferring the pattern from the photoresist to the hardmask and after the resist has been removed.

FIG. 2C shows the resultant structure formed during a typically prior art thermal nitridation process. Note that nitrogen-containing layer 20 is formed during the thermal nitridation process. FIG. 2D shows the structure that is formed after hardmask 18 has been removed from the structure.

One advantage of prior art thermal nitridation processes is that they are capable of implanting nitrogen at or near the surface of a silicon-containing substrate. Disadvantages of prior art nitridation process, however, include: (i) not directly compatible with resist processing because the resist cannot withstand high-temperatures associated with prior art nitridation processes; (ii) to achieve selective nitridation other sacrificial materials such as the hardmask illustrated in FIGS. 2A–2D must be employed (this causes the need for utilizing extra etching, deposition and stripping processes); and (iii) nitrogen may leak through the various layers, e.g., hardmask 18, used to block the silicon surface contaminating areas which are meant to be nitrogen-free.

Another prior art method which can be used in forming a patterned nitrogen-containing region at or near a surface of silicon is described, for example, in U.S. Pat. No. 6,110,842 to Okuno, et al. Specifically, Okuno, et al. disclose a method for forming integrated circuits having multiple gate oxide thicknesses utilizing a high-density plasma nitridation process to reduce the effective gate dielectric thickness in selective areas only. In one embodiment disclosed in Okuno, et al., a patterned mask is formed over a substrate and a high-density plasma nitridation process (low-temperature process) is used in forming a thin layer of nitride or oxynitride on the surface of the substrate. The patterned nitride is thereafter removed and an oxidation is performed. The thin nitride or oxynitride layer retards oxidation, whereas in the areas in which the nitride and oxynitride layer is not present, oxidation is not retarded.

Okuno, et al. disclose a second embodiment in which a thermal oxide is first grown on a substrate. Next, a pattern is then formed that exposes areas where a thinner effective gate oxide is desired. A high-density plasma nitridation is performed converting a portion of the gate oxide to a nitride or oxynitride; the effective thickness of the combined dielectric is reduced.

Although the Okuno, et al. disclosure provides a low-temperature patterned nitridation process for forming a gate dielectric having dual thicknesses, Okuno, et al. do not teach or suggest that the disclosed methods can be used during selective epi or silicide formation. Hence, there is still a need for providing a method that is capable of forming a selective epi or silicide layer on predetermined portions of a silicon-containing substrate using a masked nitridation process that overcomes the drawbacks mentioned in regard to prior art nitrogen ion implantation and thermal nitridation.

SUMMARY OF THE INVENTION

One object of the present invention is to provide a selective method of forming a nitrogen-containing layer at or very near the surface of a Si-containing substrate so as to provide a layer that prevents the subsequent formation of an epi-Si-containing layer or a silicide layer.

Another object of the present invention is to provide a low-temperature patterned nitridation (or oxynitridation) process that is compatible with a patterned photoresist that is present on a Si-containing substrate during the low-temperature nitridation (or oxynitridation) process.

A yet further object of the present invention is to provide a method of forming a nitrogen-containing layer at or very near the surface of a Si-containing substrate such that the nitrogen-containing layer formed does not adversely effect either a patterned photoresist previously formed on the Si-containing substrate or the Si-containing substrate itself.

These and other objects and advantages are achieved in the present invention by utilizing a patterned, low-temperature (on the order of about 200° C. or below) nitridation process (which also includes oxynitridation) wherein a technique such as decoupled plasma nitridation (DPN), slot plane antenna (SPA) or jet vapor nitridation (JVN) is employed. The low-temperature nitridation process of the present invention is capable of forming a nitride (or oxynitride) layer in areas of a Si-containing substrate (at or near the surface thereof) that are not protected by a patterned resist. The patterned resist is not adversely affected by the inventive method since low-temperatures are employed. Moreover, the nitride (or oxynitride) layer formed in the present invention effectively blocks the regions containing the same so as to be able to form selective epi-Si-containing or silicide layers adjacent to the nitride (or oxyitride) layer.

Oxidation of silicon to form silicon dioxide ($SiO_2$) occurs when silicon is exposed to an oxidizing ambient ($O_2$, $H_2O$) at an elevated temperature (typically above 700° C.). The oxidizing species diffuse through the previously grown oxide to the interface where it reacts with the silicon to grow more oxide. Nitrogen incorporated into oxide retards the diffusion of the oxidizing species and hence reduces the oxide growth rate. Silicidation occurs when a refractory metal such as cobalt or titanium is deposited directly on silicon, and heated above 500°–700° C., to form silicides such as $CoSi_2$ or $TiSi_2$. Nitrogen in silicon blocks this reaction by bonding with the silicon, and nitrogen rich areas remain free of silicide formation.

Selective epitaxial growth occurs when a silicon or germanium containing gas such as dichlorosilane is introduced at an elevated temperature. Any single crystalline Si or SiGe areas on the surface of the wafer that are exposed will be deposited with silicon or SiGe. Nitrogen that is incorporated into silicon or SiGe disrupts the crystallinity, and hence there is no epitaxial growth in areas that contain nitrogen.

Specifically, the method of the present invention comprises the steps of:
(a) subjecting at least one exposed surface of a Si-containing substrate to a low-temperature nitridation process so as to form a nitrogen-containing layer at or near said at least one exposed surface, wherein other surfaces of said Si-containing substrate are protected by a patterned photoresist;
(b) removing said patterned photoresist from said other surfaces of said Si-containing substrate; and
(c) forming an epi-Si-containing layer or a silicide layer on said other surfaces of said Si-containing substrate which do not contain said nitrogen-containing layer, wherein said epi-Si-containing layer or said silicide layer is not formed in areas containing said nitrogen-containing layer.

The term "Si-containing substrate" as used herein denotes a semiconductor material such as Si, SiGe, SiC or SiGeC; layered semiconductors such as Si/Si or Si/SiGe; silicon-on-insulators; polysilicon; amorphous Si; a previously pre-formed epi-Si layer; or any combination thereof. Thus, the Si-containing substrate may be a semiconductor chip or wafer, or a silicon-containing layer formed atop another material layer, i.e., a semiconductor chip or wafer, a conductive material, or a gate dielectric. The term "epi-Si-containing" as used herein denotes epi Si, epi SiGe or a combination thereof.

In accordance with the present invention, the low-temperature nitridation process includes techniques such as DPN, JVN, SPA, or any process that is capable of operating at a temperature of about 200° C. or below. Note that the term "nitridation" includes nitridation, oxynitridation or any combination thereof.

DETAILED DESCRIPTION OF THE INVENTION

Figure 1:
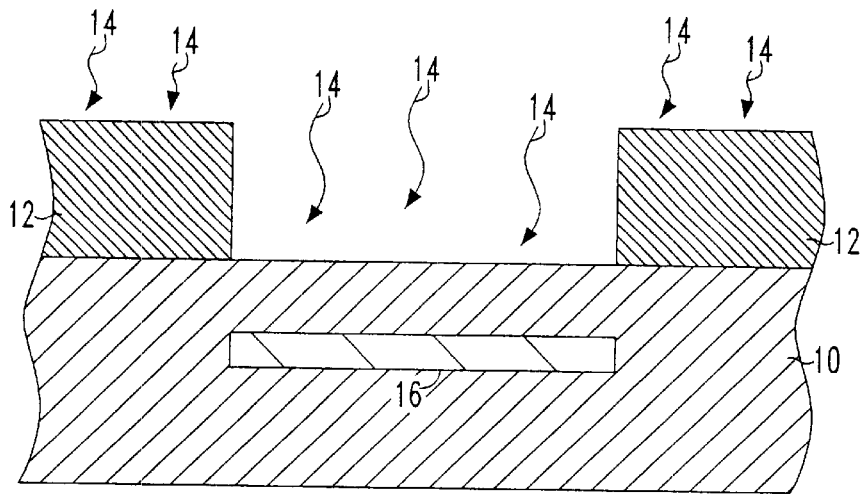
FIG. 1 is a pictorial representation (through a cross-sectional view) of a prior art patterned room temperature nitrogen ion implantation process which is employed in selectively incorporated nitrogen ions into a surface of a Si-containing substrate.
Figure 2A:
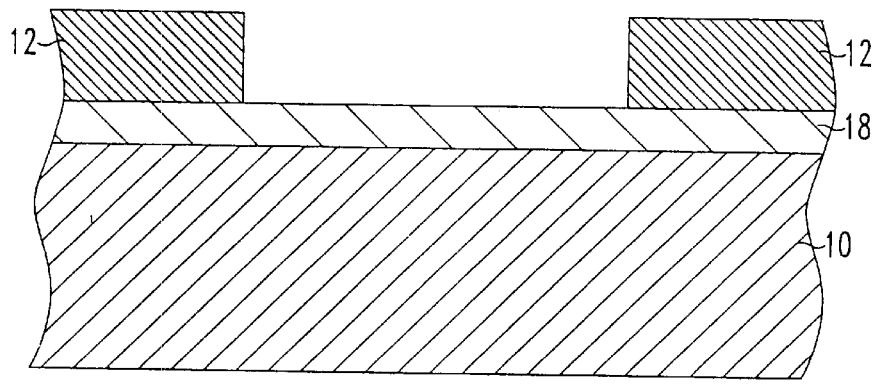
FIGS. 2A–2D are pictorial representations (through cross-sectional views) of a prior art patterned thermal nitridation process which selectively incorporates nitrogen into a surface of a Si-containing substrate.
Figure 2B:
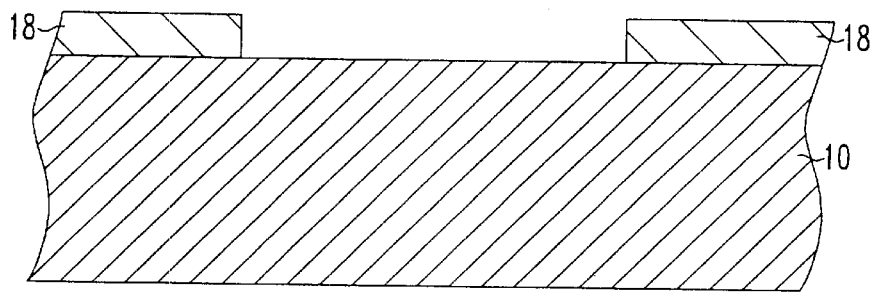
Figure 2C:
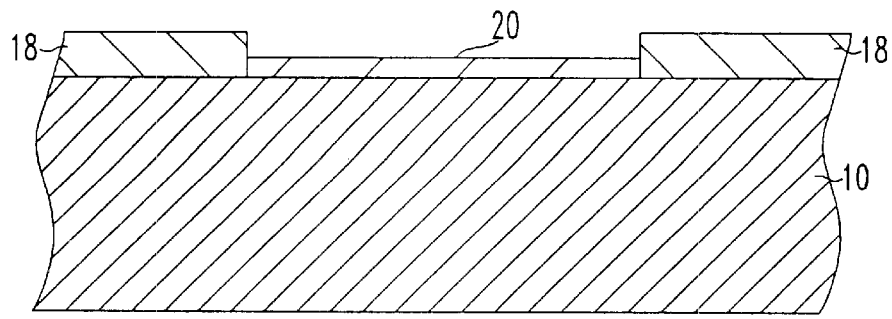
Figure 2D:
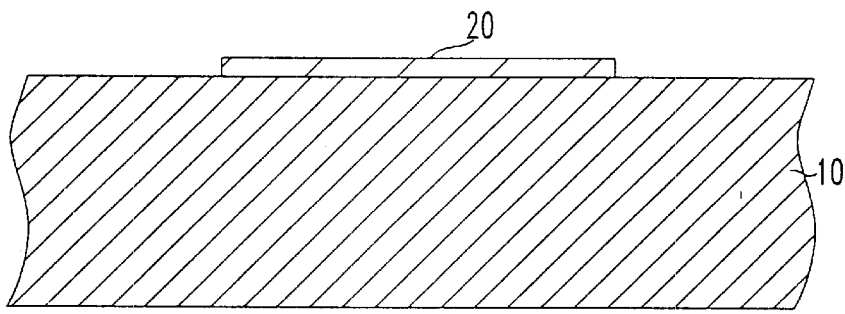

The present invention, which provides a patterned low-temperature nitridation or oxynitridation method that can be employed during the formation of a selective epi-Si-containing layer or silicide layer, will now be described in more detail by referring to the drawings that accompany the present application. It is noted that like and/or corresponding elements of the drawings are referred to by like reference numerals.

Figure 3A:
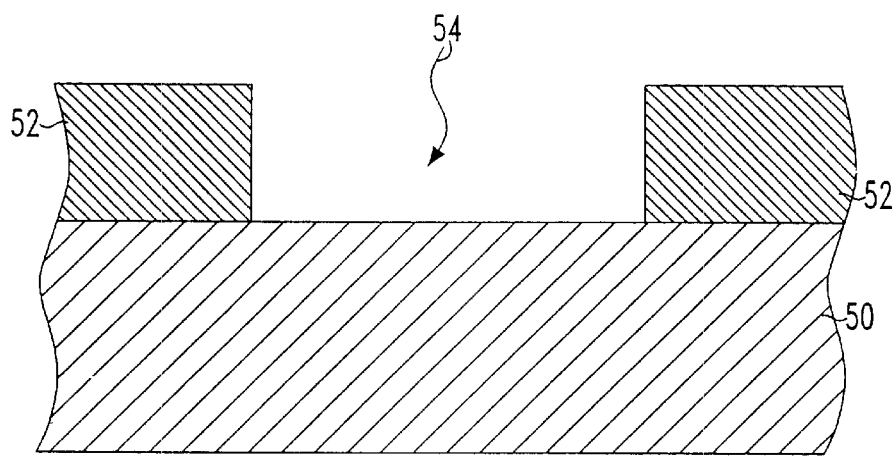
FIGS. 3A–3D are pictorial representations (through cross-sectional views) of the inventive patterned nitridation process which is carried out using low-temperature techniques such as DPN, SPA or JVN.

Reference is first made to FIG. 3A which illustrates an initial structure that can be employed in the present invention. Specifically, the initial structure shown in FIG. 3A comprises Si-containing substrate 50 having patterned photoresist 52 formed thereon. Note that in the drawing, patterned photoresist 52 has at least one opening 54 that exposes a surface of Si-containing substrate 50. Although only one opening is shown, the present invention also works in cases wherein the patterned photoresist includes more than one opening therein.

The structure shown in FIG. 3A, which includes patterned photoresist 52 blocking portions of Si-containing substrate 50, while leaving other portions of Si-containing substrate 50 exposed, is fabricated using materials and techniques well known to those skilled in the art. For example, Si-containing substrate 50 comprises a semiconductor material such as Si, SiGe, SiC or SiGeC; layered semiconductors such as Si/Si or Si/SiGe; silicon-on-insulators; polysilicon; amorphous Si; a previously preformed epi-Si layer; or any combination thereof. Thus, the Si-containing substrate may be a semiconductor chip, wafer, or a silicon-containing layer formed atop another material layer, i.e., a semiconductor chip or wafer, a conductive material, or a gate dielectric. In a preferred embodiment of the present invention, Si-containing substrate 50 is a semiconducting material such as a Si wafer or chip which serves as a bulk substrate wherein various devices such as transistors and capacitors are formed.

The patterned photoresist is formed on the surface of Si-containing substrate utilizing lithography. Specifically, the lithography step used in forming patterned photoresist 52 includes applying a conventional photoresist material to a surface of the Si-containing substrate; exposing the photoresist material to a pattern of radiation; and developing the pattern in the photoresist material by utilizing a conventional developer solution.

Figure 3B:
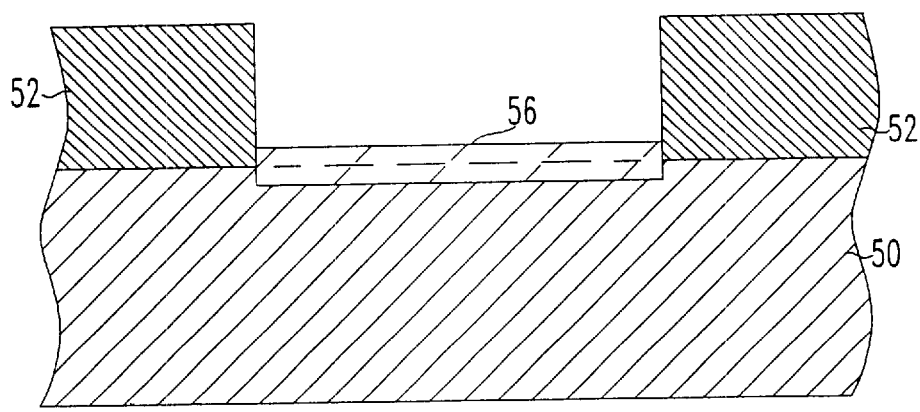

After forming the patterned photoresist on portions of the Si-containing substrate, the structure shown in FIG. 3A is then subjected to a low-temperature nitridation process which is capable of forming nitrogen-containing layer 56 at or near the exposed surface of Si-containing substrate 50 that is not protected by patterned photoresist 52. The resultant structure formed after this step of the present invention is shown, for example, in FIG. 3B. Note that a nitrogen-containing layer is not formed in areas of the Si-containing substrate that are protected by patterned photoresist 52, but instead is formed in a portion of the Si-containing substrate at opening 54.

The nitrogen-containing layer that is formed by this step of the present invention may be comprised of a nitride, oxynitride or combinations and multilayers thereof depending on the type of nitrogen ambient used in forming the same. The thickness of nitrogen-containing layer 56 may vary depending on the exact technique used, but typically nitrogen-containing layer 56 has a thickness of from about 0.1 to about 5.0 nm, with a thickness of from about 0.2 to about 2.0 nm being more highly preferred. In some embodiments of the present invention, a portion of the nitrogen-containing layer may be formed within the Si-containing substrate, as is shown, for example, in FIG. 3B.

As stated above, nitrogen-containing layer 56 is formed in the present invention by utilizing a low-temperature nitridation process. Note that the term "nitridation" as used herein denotes nitridation, oxynitridation or any combination thereof. The term "low-temperature", on the other hand, denotes a nitridation process that is carried out at a temperature of about 200° C. or less, with a temperature of from about 25° C. to about 150° C. being more highly preferred. At such temperatures, the nitridation process of the present invention is a plasma-based process. It is noted that a low-temperature nitridation process is employed herein since it is compatible with the patterned photoresist causing no substantial hardening thereof, and it causes no damage within the surface of the Si-containing substrate itself.

The nitridation process of the present invention is carried out in a nitrogen-containing ambient such as NO, $N_2$, $N_2O$, $NH_3$ or any combination thereof. In some embodiments, the nitridation process may be mixed with an inert gas such as He, Ar, Ne, Xe, Kr and mixtures thereof. When an admixture of nitrogen-containing ambient and inert gas is employed, the admixture may comprise from about 1 to about 100 weight % nitrogen-containing ambient, and from about 0 to about 99 weight % inert gas. More preferably, and in embodiments wherein a mixture of a nitrogen-containing ambient and inert gas is employed, the admixture comprises from about 5 to about 100 weight % nitrogen-containing ambient, and from about 0 to about 95 weight % inert gas. In a preferred embodiment of the present invention, $N_2$ is employed as the nitrogen-containing ambient.

Illustrative examples of different types of low-temperature nitridation processes that can be employed in the present invention, include, but are not limited to: decoupled plasma nitridation (DPN), slot plane antenna (SPA) nitridation and jet vapor nitridation (JVN).

A DPN technique is a low-temperature process in which nitrogen species are excited into a reactive state by a decoupled RF plasma, and react with the surface layer. The SPA technique is also a nitrogen plasma based process, however the plasma source is based on a microwave unit that is focused by a conducting plate that contains several holes. JVN is a process by which nitrogen species activated by a microwave plasma are supersonically ejected from a nozzle, causing a surface reaction.

In embodiments wherein DPN is used as the low-temperature nitridation technique, the following conditions are typically employed: pressure of from about 1 mT to about 1T, RF power of from about 100 W to about 1500 W, process time of from about 5 to about 500 sec, bias of from about 0 to about 50 W are typically used, with pressure of from about 5 to about 200 mT, RF power of from about 300 to about 1000 W, process time of from about 5 to about 200 sec being more desirable.

In other embodiments wherein SPA is employed as the low-temperature nitridation process, the following conditions can be employed: pressure of from about 1 mT to about 1T, microwave power of from about 100 W to about 3000 W, process time of from about 5 to about 500 sec are typically used, with pressure of from about 5 to about 200 mT, RF power of from about 500 to about 2000 W, process time of from about 5 to about 200 sec being more desirable.

In yet other embodiments wherein JVN is used as the low-temperature nitridation technique, the following conditions can be employed: microwave power of from about 50 to about 300 W, pressure of from about 0.5 to about 5T, jet velocities of from about 1 to about 10E4 cm/sec, with microwave power of from about 100 to about 200, pressure of from about 1 to about 2T, and jet velocities of about 3–5E4 cm/sec being more desirable.

It is noted that the above conditions given for the DPN, SPA and JVN techniques are exemplary and by no ways limit the scope of the present invention. Instead, other conditions which operate at the aforementioned low-temperature regime, and which do not adversely affect the patterned phototresist and/or damage the Si-containing substrate can be used in the DPN, SPA or JVN techniques mentioned above.

Figure 3C:
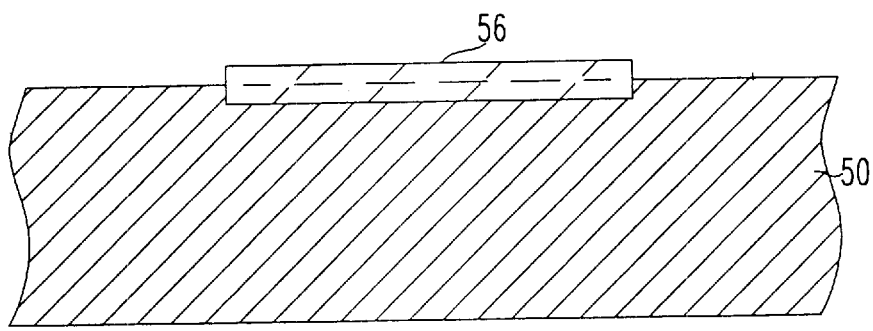

After subjecting the structure to the inventive low-temperature nitridation process, the patterned photoresist is removed from the structure providing the structure illustrated in FIG. 3C. Specifically, the patterned photoresist is removed from the structure utilizing a stripping process that is highly selective in removing photoresist as compared with the nitrogen-containing layer and the Si-containing substrate. For example a hot hydrogen peroxide and sulfuric acid solution may be used in removing the patterned photoresist from the structure.

Figure 3D:
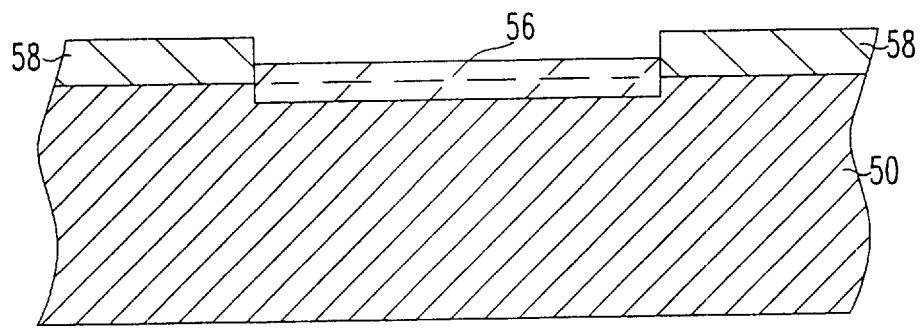

Following the removal of the patterned photoresist, the structure shown in FIG. 3C is then subjected to either a conventional epi-Si and/or epi-SiGe growth process or a silicide process. The resultant structure that is formed after the epi-Si and/or epi-SiGe process or the silicide process is shown, for example, in FIG. 3D. It is noted that in FIG. 3D, reference numeral 58 denotes either the epi-Si and/or epi-SiGe layer that is formed by the epitaxial growth process, or the silicide layer that is formed by the silicide process.

When reference numeral 58 is used to denote the epi-Si layer, the epi-Si layer is formed utilizing any conventional epitaxial Si process that is well known in the art. Specifically, the epi-Si layer is grown epitaxially utilizing a silicon-containing precursor such as dichlorosilane at a temperature of about 650° C. or above, with a growing temperature of from about 700° to about 900° C. being more highly preferred. Specifically, the epi-Si layer is formed using an admixture of dichlorosilane (0.5 l/min) and HCl (0.5 l/min, and flowing in $H_2$ (50 l/min) as a carrier gas. When an epi-SiGe is formed, $GeH_4$, germane, in an amount of up to 1 l/min may be used with the admixture of dichlorosilane and HCl. $H_2$ is also used in this embodiment as a carrier gas.

Insofar as the silicide layer is concerned, a conventional silicide process can be utilized in forming the same. Specifically, the silicide layer may be formed by first forming, via deposition, a refractory metal such as Ti, Ni or Co on the Si-containing substrate including the nitrogen-containing layer; subjecting said refractory metal layer to annealing under conditions that are capable of forming a refractory metal silicide layer therefrom, and, if required, removing any unreacted metal from the structure. Typically annealing is carried out at a temperature of about 700° C. or above, with a temperature of about 900° C. being more highly preferred. The annealing used in silicide formation is typically carried out in an inert gas such as He.

It is noted that in both cases mentioned above, nitrogen-containing layer 56 formed by the inventive low-temperature nitridation process prevents the formation of the epi-Si or epi-SiGe layer or the silicide layer in the structure. That is, selective epitaxial growth will not occur in nitrogen-containing rich areas of the structure, or silicide formation will not occur in nitrogen rich areas. Hence, the nitrogen-containing layer is employed as a blocking layer preventing formation of either the epi-Si or epi-SiGe layer or the silicide layer in regions of the Si-containing substrate that contain the same.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for selectively forming an epi-Si layer on portions of a Si-containing substrate comprising the steps of:

(a) subjecting at least one exposed surface of a Si-containing substrate to a low-temperature nitridation process so as to form a nitrogen-containing layer at or near said at least one exposed surface, wherein other surfaces of said Si-containing substrate are protected by a patterned photoresist;

(b) removing said patterned photoresist from said other surfaces of said Si-containing substrate; and (c) forming an epi-Si-containing layer on said other surfaces of said Si-containing substrate which do not contain said nitrogen-containing layer, wherein said epi-Si-containing layer is not formed in areas containing said nitrogen-containing layer.

2. The method of claim 1 wherein said Si-containing substrate is selected from the group consisting of Si, SiGe, SiGeC, SiC, Si/Si, Si/SiGe, silicon-on-insulators, polysilicon, amorphous Si, epi-Si and any combination thereof.

3. The method of claim 1 wherein said Si-containing substrate is a Si wafer or chip.

4. The method of claim 1 wherein said patterned photoresist is formed via lithography.

5. The method of claim 1 wherein said low-temperature nitridation process is a plasma-based process.

6. The method of claim 1 wherein said low-temperature nitridation process is carried out at a temperature of about 200° C. or below.

7. The method of claim 6 wherein said low-temperature nitridation process is carried out at a temperature of from about 25° to about 150° C.

8. The method of claim 1 wherein said low-temperature nitridation process is performed in a nitrogen-containing ambient.

9. The method of claim 8 wherein said nitrogen-containing ambient comprises $N_2$, NO, $NO_2$, $NH_3$ or mixtures thereof.

10. The method of claim 8 wherein said nitrogen-containing ambient is admixed with an inert gas.

11. The method of claim 10 wherein said inert gas comprises He, Ar, Ne, Xe, Kr or mixtures thereof.

12. The method of claim 1 wherein said low-temperature nitridation process is carried out in an admixture of a nitrogen-containing ambient and an inert gas, said nitrogen-containing ambient being present in an amount of from about 1 to about 100 weight %, and said inert gas is present in an amount of from about 0 to about 99 weight %.

13. The method of claim 12 wherein said nitrogen-containing ambient is present in an amount of from about 5 to about 100 weight %, and said inert gas is present in an amount of from about 0 to about 95 weight %.

14. The method of claim 1 wherein said nitrogen-containing layer comprises a nitride, an oxynitride or combinations and multilayers thereof.

15. The method of claim 1 wherein said low-temperature nitridation process comprises decoupled plasma nitridation, jet vapor nitridation or slot plane antenna.

16. The method of claim 1 wherein said patterned photoresist is removed by stripping.

17. The method of claim 1 wherein said epi-Si-containing layer is formed by an epitaxial growing process.

18. The method of claim 17 wherein said epitaxial growing process is carried out in the presence of a silicon-containing precursor and at a temperature of about 650° C. or above.

19. The method of claim 1 wherein said epi-Si-containing layer comprises epi-Si, epi-SiGe or mixtures thereof.

20. A method for selectively forming a silicide layer on portions of a Si-containing substrate comprising the steps of:

(a) subjecting at least one exposed surface of a Si-containing substrate to a low-temperature nitridation process so as to form a nitrogen-containing layer at or near said at least one exposed surface, wherein other surfaces of said Si-containing substrate are protected by a patterned photoresist;

(b) removing said patterned photoresist from said other surfaces of said Si-containing substrate; and (c) forming a silicide layer on said other surfaces of said Si-containing substrate which do not contain said nitrogen-containing layer, wherein said silicide layer is not formed in areas containing said nitrogen-containing layer.

21. The method of claim 20 wherein said Si-containing substrate is selected from the group consisting of Si, SiGe, SiGeC, SiC, Si/Si, Si/SiGe, silicon-on-insulators, polysilicon, amorphous Si, epi-Si and any combination thereof.

22. The method of claim 20 wherein said Si-containing substrate is a Si wafer or chip.

23. The method of claim 20 wherein said patterned photoresist is formed via lithography.

24. The method of claim 20 wherein said low-temperature nitridation process is a plasma-based process.

25. The method of claim 20 wherein said low-temperature nitridation process is carried out at a temperature of about 200° C. or below.

26. The method of claim 25 wherein said low-temperature nitridation process is carried out at a temperature of from about 25° to about 150° C.

27. The method of claim 20 wherein said low-temperature nitridation process is performed in a nitrogen-containing ambient.

28. The method of claim 27 wherein said nitrogen-containing ambient comprises $N_2$, NO, $NO_2$, $NH_3$ or mixtures thereof.

29. The method of claim 27 wherein said nitrogen-containing ambient is admixed with an inert gas.

30. The method of claim 29 wherein said inert gas comprises He, Ar, Ne, Xe, Kr or mixtures thereof.

31. The method of claim 20 wherein said low-temperature nitridation process is carried out in an admixture of a nitrogen-containing ambient and an inert gas, said nitrogen-containing ambient being present in an amount of from about 1 to about 100 weight %, and said inert gas is present in an amount of from about 0 to about 99 weight %.

32. The method of claim 31 wherein said nitrogen-containing ambient is present in an amount of from about 5 to about 100 weight %, and said inert gas is present in an amount of from about 0 to about 95 weight %.

33. The method of claim 20 wherein said nitrogen-containing layer comprises a nitride, an oxynitride or combinations and multilayers thereof.

34. The method of claim 20 wherein said low-temperature nitridation process comprises decoupled plasma nitridation, jet vapor nitridation or slot plane antenna.

35. The method of claim 20 wherein said patterned photoresist is removed by stripping.

36. The method of claim 20 wherein said silicide layer is formed by a silicide process, said silicide process comprises depositing a refractory metal on said Si-containing substrate, annealing said substrate so as to convert said refractory metal into a refractory metal silicide and removing any unreacted refractory metal.

* * * * *